United States Patent
Kumakura

(10) Patent No.: US 6,535,442 B2
(45) Date of Patent: Mar. 18, 2003

(54) SEMICONDUCTOR MEMORY CAPABLE OF DEBUGGING AN INCORRECT WRITE TO OR AN INCORRECT ERASE FROM THE SAME

(75) Inventor: Shinsuke Kumakura, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/015,597

(22) Filed: Dec. 17, 2001

(65) Prior Publication Data

US 2002/0141263 A1 Oct. 3, 2002

(30) Foreign Application Priority Data

Mar. 27, 2001 (JP) ........................................ 2001-089411

(51) Int. Cl.[7] .............................................. G11C 29/00
(52) U.S. Cl. .................. 365/201; 365/221; 365/185.01; 365/189.03; 365/239
(58) Field of Search ................................. 365/201, 221, 365/189.03, 185.01, 185.09, 239

(56) References Cited

U.S. PATENT DOCUMENTS 5,917,438 A * 6/1999 Ando ........................... 341/51

FOREIGN PATENT DOCUMENTS

JP           7-192479         7/1995      ........... G11C/16/06

* cited by examiner

Primary Examiner—Andrew Q. Tran
(74) Attorney, Agent, or Firm—Arent Fox Kintner Plotkin & Kahn, PLLC

(57) ABSTRACT

A command storing control circuit stores in storing units a plurality of commands supplied the latest of the supplied commands so as to execute the memory operation. A command reading control circuit reads the commands stored in a command storing area during a test mode. If incorrect data are written into a semiconductor memory, causing the system mounting the semiconductor memory to become inoperable, the cause of the trouble can be efficiently determined by utilizing the commands stored in the command storing area. As a result, the efficiency of development of the system can be improved, for example, and the cost of developing the system can be reduced. Moreover, the quality of the system can be also improved.

6 Claims, 4 Drawing Sheets

SEMICONDUCTOR MEMORY CAPABLE OF DEBUGGING AN INCORRECT WRITE TO OR AN INCORRECT ERASE FROM THE SAME

BACKGROUND OF THE INVENTION

1. Field of the Invention

This invention relates to a semiconductor memory that operates in accordance with a command supplied from the exterior of the memory.

2. Description of the Related Art

A semiconductor memory such as a flash memory or the like decodes control signals supplied via a plurality of external terminals to thereby recognize a command supplied form the exterior. An internal circuit in the memory operates, in response to the recognized command, to execute a read, write or erase operation. The statuses of the write and erase operations are transmitted to the exterior via a status terminal. As this status terminal, for example, a dedicated terminal such as a ready/busy terminal or a shared terminal such as a data input/output terminal may be used. A system mounting the flash memory can recognize, in accordance with information transmitted via the status terminal, the status of the flash memory and the result of a verify during a write operation.

As having nonvolatile memory cells, the flash memory is often used so as to store the program of a CPU for controlling the system or store data that are rewritten with little frequency.

If a system malfunction or the like occurs, causing the data stored in a program or data area of the flash memory to be overwritten or erased, then it may stop the system from operating. In such a case, since the program and data areas allocated in the flash memory are nonvolatile, the original state cannot be recovered even after powering the system off and on again.

Such a situation will occur with great frequency during development of a system mounting the flash memory, such as a cellular phone or the like. Specifically, during a debug of the system, the system would be disabled from normally operating if a problem occurring in a software causes data to be written into a program area of the flash memory. In such a case, the system developer compares the contents of the program area with respective expected values one by one to thereby locate the area where the incorrect data are written and determine the data value. However, even if successfully recognizing the area where the incorrect data are written and the data value, the system developer often cannot figure out the cause of the foregoing problem. For this reason, the occurrence of the foregoing problem significantly reduces the system debug efficiency.

SUMMARY OF THE INVENTION

It is an object of the present invention to provide a semiconductor memory that allows easy clarification of the cause of problems that a system or the like mounting the semiconductor memory has done an incorrect write to or an incorrect erase from the semiconductor memory.

According to one of the aspects of the present invention, when a command is supplied so as to execute a memory operation, a command storing control circuit stores in storing units a plurality of commands supplied the latest of the supplied commands, by controlling the command storing area. For example, if a malfunction of the system mounting the semiconductor memory causes incorrect data to be written into the semiconductor memory or data stored in the semiconductor memory to be incorrectly erased therefrom, the state of the semiconductor memory is shifted to a test mode. In response to this shift to the test mode, a command reading control circuit controls the command storing area to read the commands stored therein. Thereafter, a system developer or the like analyzes the commands stored in the command storing area to determine the cause of the trouble.

Thus tracking, in the order of time series, the processes of the write and erase operations of the semiconductor memory can efficiently determine the cause of the trouble. As a result, the efficiency of development of the system mounting the semiconductor memory can be improved, for example, and the cost of developing the system can be reduced. Moreover, the quality of the system can be also improved.

According to another aspect of the present invention, when receiving via an external terminal a voltage that is not supplied in a normal operation mode executing the memory operation, the semiconductor memory gets into the test mode, activating the reading control circuit. Operating the reading control circuit only in the test mode prevents commands from erroneously being read from the command storing area during execution of the normal operation.

According to another aspect of the present invention, the storing units include electrically rewritable nonvolatile elements, so that even if the power supply is cut off, the commands can be held. Accordingly, even if incorrect data are written into the semiconductor memory, causing the system mounting the semiconductor memory to become inoperable, for example, powering the system on again allows the commands stored in the storing units to be read therefrom without fail.

According to another aspect of the present invention, the command storing control circuit sequentially stores the commands in the command storing area. After the number of the empty units in the storing units with no commands stored becomes one, every time a command is supplied anew, the command is stored in the empty unit, and the oldest command is erased at the same time to reserve an empty unit anew. As a result, the empty unit can be utilized as a pointer that indicates the storing unit where the latest command is stored, whereby the order the commands stored in the command storing area were supplied can be easily recognized.

According to another aspect of the present invention, every time a command is supplied anew, data are read from all the storing units in the command storing area, whereby the empty units can be easily detected by simply controlling the command storing control circuit.

According to another aspect of the present invention, the command storing control circuit sequentially stores the commands in the command storing area. After the commands are stored in all the storing units of the command storing area, each time a command is supplied anew, the oldest command is erased to reserve an empty unit, in which the command supplied anew is stored. For example, the storing unit where the latest command is stored is recognized by use of a pointer, thereby improving the storing efficiency of the command storing area.

BRIEF DESCRIPTION OF THE DRAWINGS

The nature, principle, and utility of the invention will become more apparent from the following detailed description when read in conjunction with the accompanying drawings in which like parts are designated by identical reference numbers, in which.

DESCRIPTION OF THE PREFERRED EMBODIMENTS

An embodiment of the present invention will be described below with reference to the drawings.

Figure 1:
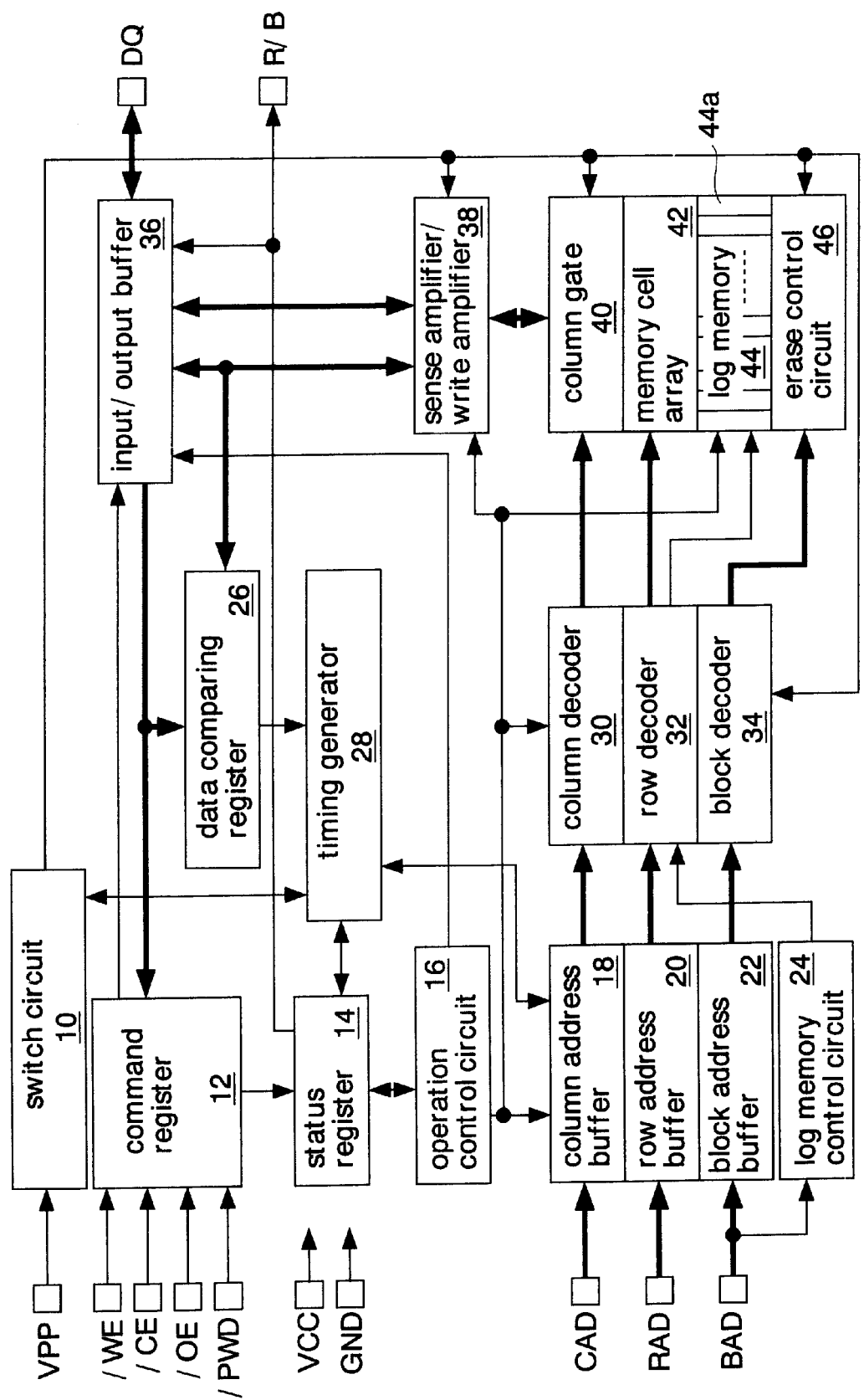
FIG. 1 is a block diagram showing an embodiment of the present invention.

FIG. 1 shows an embodiment of a semiconductor memory according to the present invention.

This semiconductor memory is formed, as a flash memory, on a silicon substrate by use of a CMOS process. The bold arrows in the Figures are consisted of a plurality of signal lines.

The flash memory has external terminals /WE, /CE, /OE, /PWD, CAD, RAD, BAD, DQ, and R/B for signal inputs/outputs, and also has power supply terminals VCC, GND and VPP. The /WE, /CE and /OE terminals receive a write enable signal /WE, a chip enable signal/CE, and an output enable signal /OE, respectively. The /PWD terminal receives a power down signal /PWD for placing the flash memory in a mode of low power consumption. The /WE, /CE, /OE, and /PWD signals are command signals that are supplied from the exterior for executing memory operations. That is, a command supplied from the exterior is recognized in accordance with the combination in logic level of these /WE, /CE, /OE and /PWD signals. The CAD, RAD and BAD terminals receive a column address signal CAD, a row address signal RAD and a block address signal BAD, respectively. The DQ terminals receive a data input/output signal DQ (write data, command data) during a write operation, and outputs a data input/output signal DQ (read data, status data) during a read operation. The R/B terminal outputs a low level (busy) during write and erase operations, and outputs a high level (ready) when a command can be accepted. The power supply terminals VCC, GND and VPP are supplied with a power supply voltage VCC, a ground voltage GND and a program voltage VPP (a high voltage). The symbol "/" prefixed to the reference labels of the signals and terminals represents a negative logic.

The flash memory includes a switch circuit 10 for switching between the read operation and the write/erase operations, a command register 12, a status register 14, an operation control circuit 16, a column address buffer 18, a row address buffer 20, a block address buffer 22, a log memory control circuit 24, a data comparing register 26, a timing generator 28 for the write and erase operations, a column decoder 30, a row decoder 32, a block decoder 34, an input/output buffer 36, a sense amplifier/write amplifier 38, a column gate 40, a memory cell array 42, a log memory 44, and an erase control circuit 46.

The switch circuit 10 receives an instruction from the timing generator 28 to control the sense amplifier/write amplifier 38, the column gate 40, the erase control circuit 46 and the block decoder 34 during write and erase operations.

The command register 12 is a command decoder for decoding the command signals /WE, /CE, /OE, and /PWD and a command data from the input/output buffer 36. The command register 12 has a command table for decoding the command signals and command data when a correct command is supplied. The command register 12 outputs that correct command to the status register 14 and to the input/output buffer 36. The input/output buffer 36 is provided with commands related to the write and erase operations but is not provided with any commands related to the read operation. Any commands related to the write and erase operations (which will be referred to as "log commands" hereinafter) are written into the log memory 44 via the sense amplifier/write amplifier 38. When an incorrect command that is not written in the command table is supplied, the command register 12 invalidates that command input. The log commands include, for example, a written command, a sector erase command, and a chip erase command. These log commands have their respective assigned numbers such as "01", "02", and "03" in hexadecimal. These numbers (each one-byte data) are written into the log memory 44.

The status register 14 controls the operation control circuit 16 and the timing generator 28 on the basis of the command and command information. Additionally, the status register 14 outputs, as the R/B signal, the state of operation of the internal circuit of the memory transmitted by the operation control circuit 16. The operation state of the internal circuit is also outputted at the data input/output terminal DQ via the input/output buffer 36.

The operation control circuit 16 outputs timing signals for activating (operating) the address buffers 18, 20 and 22, the decoders 30, 32 and 34, the input/output buffer 36, the sense amplifier/write amplifier 38 and the log memory 44. The operation control circuit 16 also functions as a command storing control circuit for storing commands supplied from the exterior in the log memory 44, as described later. Additionally, the operation control circuit 16 receives and understands which operation state the internal circuit is in and transmits the information of that operation state to the status register 14.

The address buffers 18, 20 and 22 receive the address signals CAD, RAD and BAD, respectively, and output their respective received addresses to the column decoder 30, the row decoder 32 and the block decoder 34, respectively.

Activated in response to the fact that a predetermined one-bit (a test mode signal) of the block address signals BAD exhibits a high voltage, the log memory control circuit 24 places the flash memory in a test mode from the normal operation mode. That high voltage is a voltage (e.g., 12V) that is not supplied as the block address signal BAD in the normal operation mode. The log memory control circuit 24 then activates a decoder for the log memory 44 included in the row decoder 32. The log memory control circuit 24 also functions as a command reading control circuit for reading the commands logged in the log memory 44. The circuit in the row decoder 32 to be used in the normal operation mode is inactivated in the test mode and therefore cannot access the memory cell array 42.

The data comparing register 26 is a verify circuit for comparing a write data supplied from the exterior during the write operation with the data actually written in a memory cell. The result of verification is outputted to the timing generator 28.

The timing generator 28 generates timing signals required for the operations of the internal circuit during the write and erase operations.

The decoders 30, 32 and 34 decode the address signals CAD, RAD and BAD supplied from the address buffers 18, 20 and 22, respectively, and output the decoded signals to the column gate 40, the memory cell array 42 and the erase control circuit 46, respectively. The log memory 44 decoder included in the row decoder 32 outputs a signal for activating the log memory 44 in the test mode.

The input/output buffer 36 receives/supplies input/output data signals DQ from/to the DQ terminal, the sense amplifier/write amplifier 38, etc.

The sense amplifier/write amplifier 38 in the normal operation mode amplifies the data read from the memory cell array 42 and outputs the amplified data to the input/output buffer 36, and outputs the write data and log commands supplied via the input/output buffer 36 to the memory cell array 42 and log memory 44, respectively. The sense amplifier/write amplifier 38 in the test mode amplifies the data (the log commands) read from the log memory 44 and outputs the amplified data to the input/output buffer 36.

The column gate 40 connects the sense amplifier/write amplifier 38 with a predetermined memory cell (which will be described later) associated with a column address signal CAD.

The memory cell array 42 has a plurality of blocks including electrically rewritable nonvolatile memory cells each having a control gate and a floating gate. Each block has a plurality of sectors.

The log memory 44 includes electrically rewritable nonvolatile memory cells each having a control gate and a floating gate. That is, the log memory 44 and memory cell array 42 have the same memory cells. The log memory 44 has twenty storing units 44a each of one byte and is a command storing area for storing log commands supplied so as to execute memory operations. The log memory 44 is controlled by the operation control circuit 16 to store the log commands supplied from the exterior in the order of time series in the normal operation mode. The operation control circuit 16 writes the latest log command and erases the oldest log command such that there always exist one or more empty units (storing units 44a) where no log commands are stored. That is, last nineteen log commands are logged in the log memory 44. The log memory 44 is controlled by the log memory control circuit 24 to output the logged log commands to the exterior of the test mode. The operations of the operation control circuit 16, the log memory control circuit 24 and the log memory 44 will be described in detail later.

The erase control circuit 46 controls, in accordance with the decoded signal from the block decoder 34, a block in which data should be erased, causing the data in the block to be erased.

Figure 2:
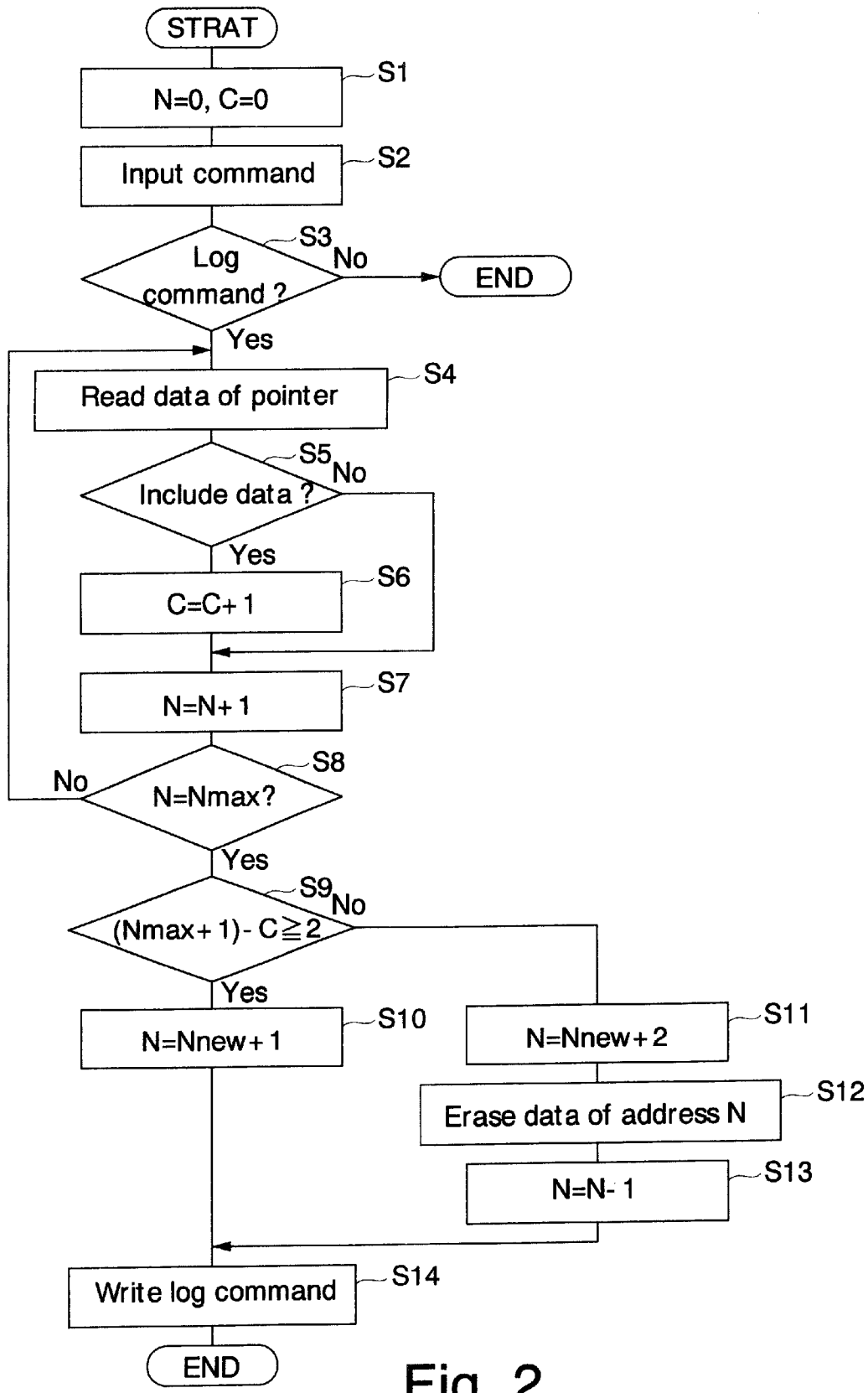
FIG. 2 is a flowchart showing a procedure of writing a log command.

FIG. 2 shows a procedure through which the flash memory writes log commands into the log memory 44 in the normal operation mode. The flow of FIG. 2 is a procedure executed by the operation control circuit 16.

Firstly, in a step S1, the address "N" and counter C of the log memory 44 are reset to zero. The value indicated by the counter C will be referred to hereinafter as "count C". Here, "N" is the number of respective storing units 44a for storing a log command therein, and in this embodiment, "N"="0" to "19". Assuming that the address "N" is "19", when the address increases by one, the address "N" will return to "0". Similarly, assuming that the address "N" is "0", when the address decreases by one, the address "N" will be "19". The count C represents the number of the storing units 44a where the log commands are stored.

In a step S2, a command is inputted externally to the flash memory. In a step S3, it is determined whether the inputted command is a log command or not. If not, the procedure ends. Here, both the case when the inputted command is not related to the write and erase operations and the case when the inputted command is an incorrect command correspond to the case when the inputted command is not a log command. If the inputted command is a log command, then the procedure goes on to a step S4.

In steps S4 to S8, the number of the storing units 44a where the log commands are stored is counted. At first, in the step S4, data are read from the storing unit 44a indicated by the address "N".

In the step S5, it is judged whether the data thus read is a log command or not. For example, writing in advance "FF" in hexadecimal into the storing units 44a where no log commands are stored allows this judging to be easily performed. If the data thus read is a log command, the procedure goes on to the step S6; otherwise, it goes on to the step S7.

In the step S6, the count C is incremented by one. That is, the number of the storing units 44a where the log commands are stored is counted. In the step S7, the address "N" is incremented by one.

In the step S8, it is judged whether or not the address "N" is the maximum value "Nmax" (in this embodiment, "Nmax"="19"), and hence whether or not the data are read from all the storing units 44a. If the data are read from all the storing units 44a, the procedure goes on to a step S9. That is, each time a command is supplied anew, the data are read from all the storing units 44a by the processes of the steps S4 to S8. These processes detect empty units 44a where no log commands are stored. If there exists any storing unit 44a from which no data are read yet, the procedure goes back to the step S4 again.

Additionally, the processes of the steps S4 to S8 find out the address "Nnew" where the latest log command is written. If there exist a plurality of storing units 44a where no log commands are stored, the address "Nnew" is the largest of the addresses "N" of the storing units 44a where the log commands are stored. If there exists only one storing unit 44a where no log command is stored, then the address "Nnew" is the address "N" of this storing unit 44a minus one, that is, the address "N-1".

In steps S9 to S14, a command supplied anew is written, as a log command, into a predetermined storing unit 44a of the log memory 44.

At first, in the step S9, "(Nmax+1)-C" is calculated, thereby obtaining the number of the empty units of the storing units 44a, where no log commands are stored (the storing units 44a where the data "FF" are written). If the number of the empty units is equal to or greater than two, the procedure goes on to the step S10. If the number of the empty units is one, the procedure goes on to the step S11.

In the step S10, the address "N" where the log command supplied anew is to be written is set to a value greater than the address "Nnew" by one. On the other hand, in the step S11, the address "N" is set to a value greater than the address "Nnew" by two. In the step S12, the log command stored in the address "N" (the oldest log command) is erased. In the step S13, the address "N" is decremented by one. In the step S14, the log command supplied anew is written into the storing unit 44a of the address "N".

Thus, in the steps S11 to S14, after the log command is erased in the step S12, the new log command is written in the step S14. For this reason, even if the power supply should be cut off during writing a log command into the log memory 44, there can always exist empty unit(s) in the log memory 44. As a result, the position of the empty unit(s) is utilized to locate the area where the latest command is stored.

Through the processes described above, each time a log command is supplied anew after nineteen or more writings of the previous log commands into the log memory 44 with one empty unit left, the new log command is stored into the empty unit, and the oldest log command is erased. That is, there always exist one storing unit 44a where no log command is stored (an empty unit). Besides, the latest log command is stored in the storing unit 44a whose address (the address "Nnew") is smaller than the address "N" of the empty unit by one. In this way, the empty unit can be utilized as a pointer for indicating the storing unit 44a where the latest log command is stored.

Figure 3:
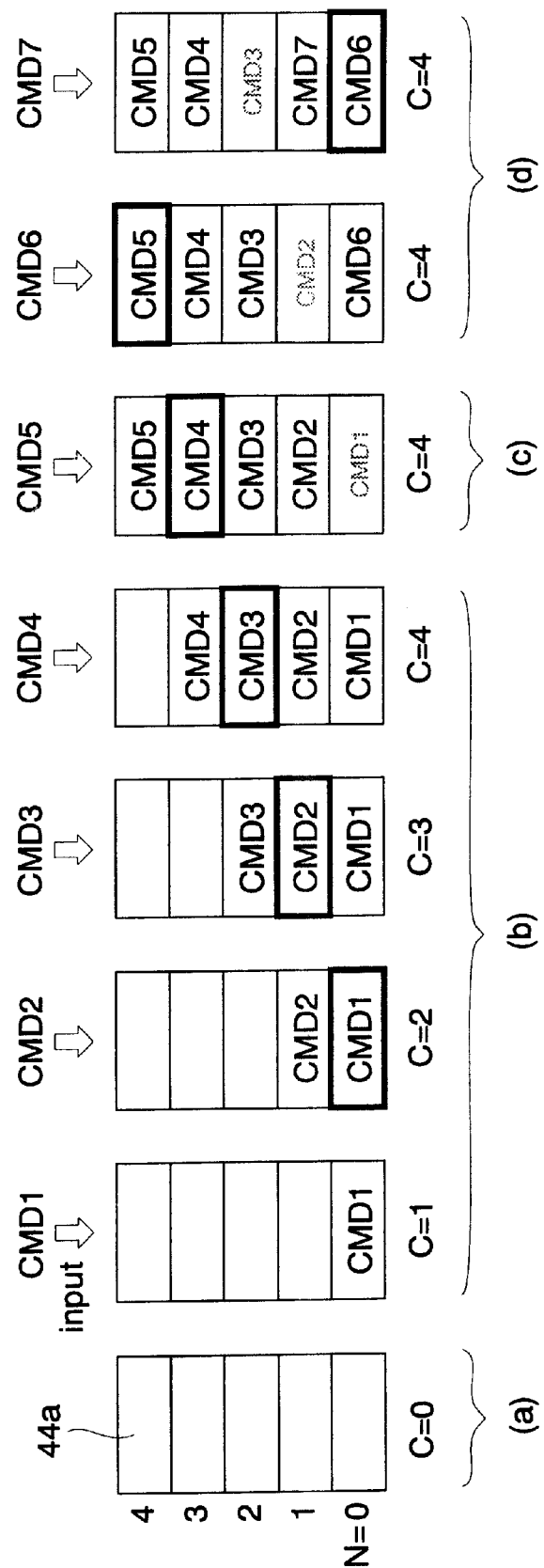
FIG. 3 is a diagram for explaining the state in which the log command is written into a log memory.

FIG. 3 shows the manner in which log commands are sequentially written into the storing units 44a of the log memory 44 in accordance with the flow described above. In this example, for purposes of simple explanation, assume that the number of the storing units 44a of the log memory 44 is five ("N"="0" to "4"). Each time a log command is written, the state of the log memory 44 changes as illustrated from the left to the right in the FIG. 3. In this figure, the storing units 44a designated by thick frames have their respective addresses "Nnew" each where the latest log command is written when a log command is inputted to the flash memory.

In FIG. 3(*a*), no log command is written in the log memory 44 (count "C"="0"). In FIG. 3(*b*), log commands CMD1, CMD2, CMD 3 and CMD 4, when inputted to the flash memory, are sequentially written into the respective storing units 44a of the log memory 44 (count "C"="1" to "4"). The write operation thus far is carried out according to the processes of the steps S9, S10 and S14 of FIG. 2.

After there is only one empty unit left, a log command write operation is carried out according to the processes of the step S9 and steps S11 to S14 of FIG. 2. In FIG. 3(*c*), a log command CMD5 is inputted to the flash memory. Since there exists only one empty unit, the log command CMD1 stored in the storing unit 44a whose address ("N"="0") is two ahead of the address "Nnew" ("N"="3") is erased. Thereafter, the new log command CMD5 is written into the storing unit 44a whose address ("N"="4") is next to the address "Nnew". Then, the address "Nnew" is incremented by one.

In FIG. 3(*d*), a log command CMD6 is inputted to the flash memory. Since there exists only one empty unit, the log command CMD2 stored in the storing unit 44a whose address ("N"="1") is two ahead of the address "Nnew" ("N"="4") is erased. Thereafter, the new log command CMD6 is written into the storing unit 44a whose address ("N"="0") is next to the address "Nnew". Similarly, a log command CMD7 is written into a storing unit 44a of the log memory 44, and the log command CMD3 is erased.

As described above, since one empty unit always exists in the log memory 44, the address "Nnew" where the latest log command is written can be easily recognized without providing any special pointer. As a result, both the address "N" of the storing unit 44a where a log command is to be written and the address "N" of the storing unit 44a where a log command is to be erased can be easily recognized. The log commands are logged into the log memory 44 in the order of time series. Therefore, when reading the log commands from the log memory 44, the application order of the commands logged in the log memory 44 can be easily recognized.

Figure 4:
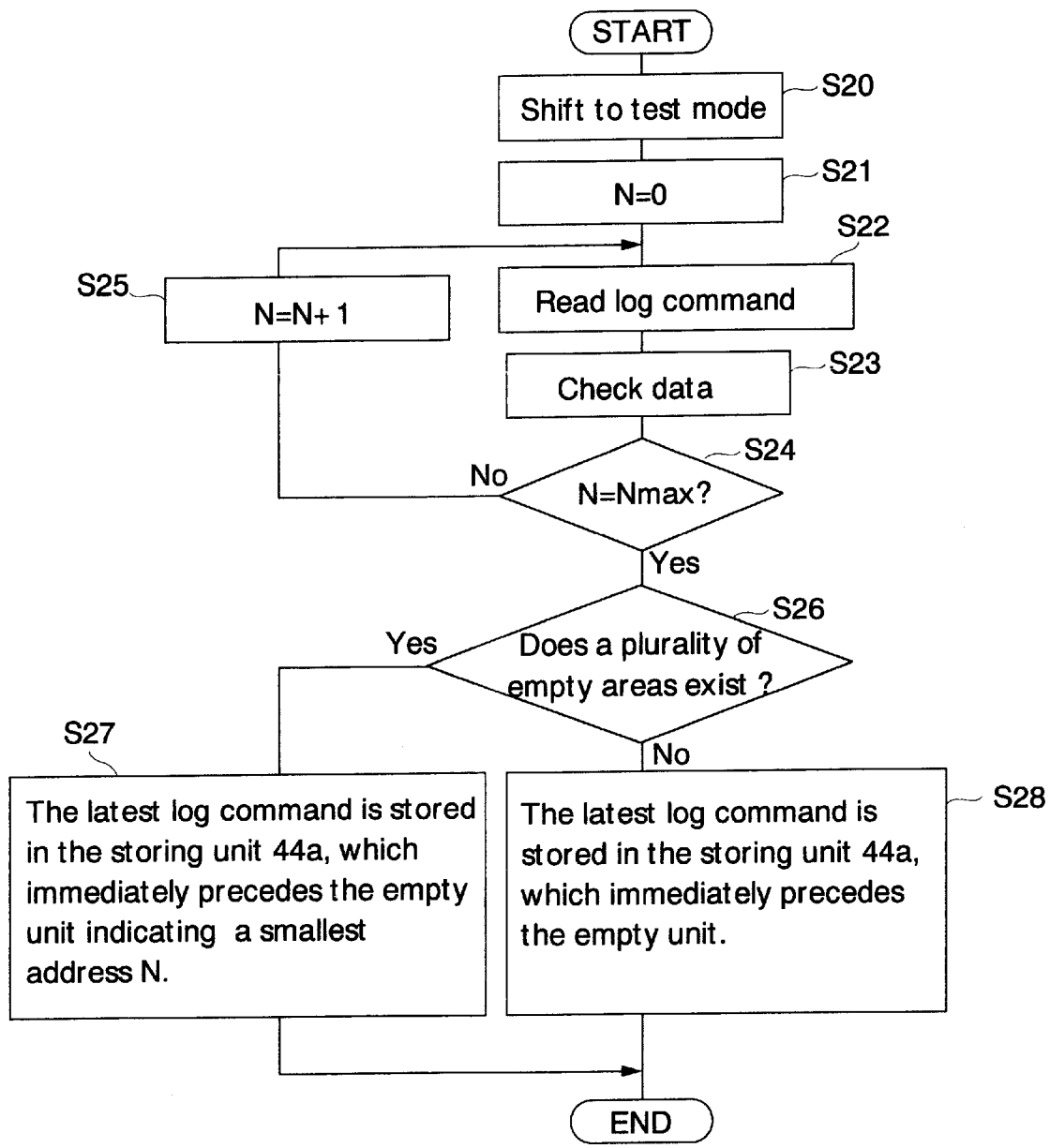
FIG. 4 is a flowchart showing a procedure of reading the log command.

FIG. 4 shows a procedure of reading the log commands written in the log memory 44. The system mounting the flash memory carries out the flow of FIG. 4 by placing the flash memory in a test mode. For example, this procedure is carried out if unintended data are written into the flash memory or if data written in an unintended area is erased, resulting in a trouble occurring in the system operation during development of the system. When the flow of FIG. 4 is carried out, the internal circuit of the flash memory is controlled by the log memory control circuit 24.

The storing units 44a of the log memory 44 include electrically rewritable nonvolatile elements. Therefore, even if the power supply for the flash memory is cut off, the commands stored in the storing units 44a are not erased but can be read without fail.

Firstly, in a step S20, a predetermined one-bit (a test mode signal) of the block address signals BAD is supplied with a high voltage, which activates the log memory control circuit 24 to place the flash memory in a test mode. That is, the log memory control circuit 24 operates only in the test mode. This prevents any command from erroneously being read from the log memory 44 during execution of the normal operation. Next, in a step S21, the address "N" of the log memory 44 is reset to zero.

In a step S22, data logged in the log memory 44 is read therefrom. In a step S23, it is checked whether the data thus read is a log command or not. When the data thus read is "FF", the system recognizes that it is not a log command.

Next, in a step S24, it is determined whether the address "N" is the maximum value "Nmax" (in this embodiment, "Nmax"="19") or not, whereby it is determined whether or not the data are read from all the storing units 44a. If the data are read from all the storing units 44a, then the procedure goes on to a step S26. If there exists any storing unit 44a from which no data are read, then the procedure goes on to a step 525, where the address "N" is incremented by one, and then goes back to the step S22 again.

In steps S26 through S28, the latest inputted log command is searched for. Firstly, in the step S26, it is judged based on the check result of the step S23 whether or not there exist a plurality of empty units. If there exist a plurality of empty units, the procedure goes on to the step S27. If there exists only one empty unit, the procedure goes on to the step S28.

In the step S27, it is recognized that the latest log command is stored in the storing unit 44a that immediately precedes an empty unit of the plurality of empty units, the empty unit having an address "N" which is the smallest among the plurality of empty units. In the step S28, it is recognized that the latest log command is stored in the storing unit 44a that immediately precedes the empty unit.

Thereafter, according to the result of the process of the step S27 or S28, the system rearranges, in the order of time series, the log commands read in the step S22. The cause of the trouble in the system can be determined from the history of these log commands.

In the present embodiment described above, the log memory 44 sequentially stores a plurality of the latest supplied commands of commands supplied from the exterior in the normal operation mode. For this reason, if incorrect data are written into the flash memory or if data stored in the flash memory is incorrectly erased, the cause of the trouble can be efficiently determined because the plurality of the latest supplied commands can be analyzed by reading the commands logged in the log memory 44. That is, when a trouble occurs in the system, the processes of the write and erase operations of the flash memory can be tracked in the order of time series. This can improve the efficiency of development of a system mounting a flash memory, reduce the cost of development of the system and improve the quality of the system.

As stated above, the present embodiment can improve, for example, the efficiency at the time of developing (debugging) a system mounting a flash memory, reduce the cost of developing the system, and improve the quality of the system.

A predetermined one-bit (a test mode signal) of the block address signals BAD was supplied with a high voltage, thereby placing the flash memory in a test mode, whereby the commands logged in the log memory 44 were read therefrom. That is, when a voltage that is not supplied in the normal operation mode that executes the memory operation is received via an external terminal, the flash memory is placed in the test mode, activating the log memory control circuit 24. Activating the log memory control circuit 24 only in the test mode can prevent any command from erroneously being read from the log memory 44 during execution of the normal operation.

The storing units 44a of the log memory 44 include electrically rewritable nonvolatile elements. For this reason, for example, even if incorrect data are written into the flash memory, making the system inoperable, then the commands stored in the storing units 44a can be read without fail by powering the system off and on again.

Under control by the operation control circuit 16, there always existed one or more empty units. For this reason, the empty units can be utilized as a pointer that indicates the storing unit 44a where the latest command is stored. As a result, the application order of the commands stored in the log memory 44 can be easily recognized.

Each time a command was supplied anew, the data were read from all the storing units 44a of the log memory 44. Thus, the empty units can be easily detected under a simple control by the operation control circuit 16.

The above embodiment was described concerning an example that there always existed one or more empty units in the log memory 44. The present invention, however, is not limited to this embodiment. For example, holding, as a pointer, the address "Nnew" of the storing unit 44a where the latest log command is written can eliminate the necessity of the empty units.

The above embodiment was described concerning an example that the capacity of the log memory 44 was set to a capacity (twenty bytes) that can log nineteen log commands. The present invention, however, is not limited to this embodiment. The capacity of the log memory 44 may be greater or less than twenty bytes and may be set to such a capacity that the cause of an erroneous write to or an erroneous erase from the flash memory can be easily determined.

The above embodiment was described concerning an example that the commands supplied from the exterior were logged in the log memory 44. The present invention, however, is not limited to this embodiment. The capacity of the log memory 44 may be increased such that not only commands but also at least either the data or addresses associated with the commands can be logged in the log memory 44.

The above embodiment was described concerning an example that the present invention was supplied to the flash memory that is a nonvolatile semiconductor memory. The present invention, however, is not limited to this embodiment. For example, the present invention may be applied to a volatile semiconductor memory such as SRAM, DRAM or the like. Instead, the present invention may be supplied to a system LSI implementing such a semiconductor memory.

The invention is not limited to the above embodiments and various modifications may be made without departing from the spirit and scope of the invention. Any improvement may be made in part or all of the components.

What is claimed is:

1. A semiconductor memory comprising:

a command storing area having a plurality of storing units for storing commands supplied so as to execute a memory operation;

a command storing control circuit for storing in said storing units a plurality of commands supplied the latest of said supplied commands, by controlling said command storing area; and a command reading control circuit for reading said commands stored in said command storing area, by controlling said command storing area during a test mode.

2. The semiconductor memory according to claim 1, wherein said reading control circuit is activated when receiving via an external terminal a voltage that is not supplied in a normal operation mode, which is a mode that executes the memory operation.

3. The semiconductor memory according to claim 1, wherein said storing units comprise electrically rewritable nonvolatile elements.

4. The semiconductor memory according to claim 1, wherein said command storing control circuit sequentially stores said commands in said command storing area, and stores each of said commands in each empty unit every time said each command is supplied anew and reserves an empty unit anew by erasing the oldest command when the number of empty units becomes one, the empty units being included in said storing units with no commands stored.

5. The semiconductor memory according to claim 4, wherein said command storing control circuit detects said empty units by reading data from all of said storing units each time a command is supplied anew.

6. The semiconductor memory according to claim 1, wherein said command storing control circuit sequentially stores said commands in said command storing area, reserves an empty unit every time a command is supplied anew, by erasing the oldest command, the reserving being done after said commands are stored in all said storing units, and stores said command supplied anew in said empty unit.

* * * * *